United States Patent [19]

Payne

[11] Patent Number: 4,588,421

[45] Date of Patent: May 13, 1986

[54] AQUEOUS SILICA COMPOSITIONS FOR POLISHING SILICON WAFERS

[75] Inventor: Charles C. Payne, Aurora, Ill.

[73] Assignee: Nalco Chemical Company, Oak Brook, Ill.

[21] Appl. No.: 736,056

[22] Filed: May 20, 1985

Related U.S. Application Data

[63] Continuation-in-part of Ser. No. 660,683, Oct. 15, 1984, abandoned.

[51] Int. Cl.⁴ ............................................. B24B 1/00
[52] U.S. Cl. ................................... 51/308; 51/283 R
[58] Field of Search ................. 51/283 R, 281 R, 323, 51/307, 308, 293; 106/3

[56] References Cited

U.S. PATENT DOCUMENTS

| | | | |
|---|---|---|---|
| 3,170,273 | 2/1965 | Walsh et al. | 51/281 |
| 3,715,842 | 2/1973 | Tredinnick et al. | 51/308 |
| 3,877,183 | 4/1975 | Deckert et al. | 51/308 |
| 3,922,393 | 11/1975 | Sears, Jr. | 51/308 |
| 4,057,939 | 11/1977 | Basi | 51/308 |
| 4,169,337 | 10/1979 | Payne | 51/283 R |
| 4,462,188 | 7/1984 | Payne | 51/283 R |

*Primary Examiner*—Frederick R. Schmidt
*Assistant Examiner*—Robert A. Rose
*Attorney, Agent, or Firm*—John G. Premo; Donald G. Epple

[57] ABSTRACT

A composition useful in polishing silicon wafers and like materials which comprises an aqueous colloidal silica sol or gel and from 0.1–5% by weight based on the $SiO_2$ content of the sol or gel of piperazine.

8 Claims, No Drawings

AQUEOUS SILICA COMPOSITIONS FOR POLISHING SILICON WAFERS

INTRODUCTION

This is a continuation-in-part patent application based upon originally filed patent application, Ser. No. 660,683, filed Oct. 15, 1984 now abandoned.

U.S. Pat. No. 3,170,273, the disclosure of which is incorporated herein by reference, shows that colloidal silica and silica gels are useful as polishing agents for the surfaces of semi-conductor crystals which are most often used in the manufacture of semi-conductor devices. The siliceous polishing agents of this patent are particularly suited to producing highly polished surfaces on silicon crystal wafers, thus rendering these surfaces suitable for the disposition of an epitaxially deposited crystal layer.

The colloidal silica as a sol and silicate gels used by the patentee have an ultimate particle size of 4–200 nanometers. From a commercial standpoint, it is preferred to use as the polishing agents in the process of the patent aqueous colloidal silica sols having particle sizes within the range of 4–100 nanometers.

A substantial improvement in polishing efficiency over U.S. Pat. No. 3,170,273 is disclosed in U.S. Pat. No. 4,169,337. The disclosure is incorporated herein by reference. In accordance with that invention, it was found that semi-conductor surfaces of the type previously described and, most particularly, silicon, can be efficiently polished by using as the polishing agent a combination of either a colloidal form of silica or silica gel having an ultimate particle size within the range of 4–200 nanometers and, preferably, 4–100 nanometers, with a water-soluble amine. The amount of amine in relation to the silica present in the silica sol or gel may range between 0.5–5.0% based on the $SiO_2$ content of the sol or gel. The preferred amount of the amine is 1.0–5.0% and, most preferably, it is 2.0–4.0%.

The amines should contain between 2–8 carbon atoms and are preferably aliphatic in character.

In U.S. Pat. No. 4,462,188 there are disclosed further improved aqueous silica compositions for polishing silicon wafers. In particular, this patent disclosed that polishing agents used in the practice of U.S. Pat. No. 4,169,337 can be improved substantially if there is added to such compositions between 0.1–5.0% and, most preferably, between 2.0–4.0% by weight of a water-soluble quaternary ammonium salt or base.

In a preferred embodiment, the water-soluble quaternary ammonium salts or hydroxides should not contain more than 6 carbon atoms. In a preferred embodiment, they contain one or more alkyl groups that should not exceed 2 carbon atoms in chain length. The compounds may, of course, contain one or more aromatic groupings as long as water-solubility is maintained. They may contain the nitrogen atom as a part of a heterocyclic grouping such as the quaternary ammonium salts of morpholine and the like.

Typical water-soluble quaternary ammonium salts and bases that can be used in the invention of U.S. Pat. No. 4,462,188 are tetramethyl ammonium chloride, tetramethyl ammonium hydroxide, dimethyl diethyl ammonium chloride, N,N dimethyl morpholinium sulfate and tetrabutyl ammonium bromide. Of these materials, tetramethyl ammonium chloride is preferred.

THE INVENTION

The invention comprises an improved method for polishing silicon wafers and like materials which comprises using as a polishing agent a colloidal silica or a gel which is combined with 0.1%–5% by weight of a piperazine or a lower alkyl nitrogen-substituted piperazine based on the $SiO_2$ content of the sol. The piperazine may be combined with an additional 0.1–5% by weight of a wter-soluble quaternary ammonium salt or base which contains not more than 6 carbon atoms.

The Starting Silica Sols

As indicated, a wide variety of aqueous colloidal silicas or gels may be used in the practice of the invention. The colloidal silicas are preferred. Two such materials are sold under the designation NALCOAG 1050 and NALCOAG 1060. These silica sols and their properties are described below:

| NALCOAG 1050 | |
|---|---|
| Colloidal silica as $SiO_2$ = | 50% |
| pH = | 9.0 |
| Average Particle Size = | 16–25 nm |
| Average Surface Area = | 120–176 $M^2$/gram |
| Specific Gravity (at 68° F.) = | 1.390 |
| Viscosity = | 70 cps (maximum) |
| $Na_2O$ content = | 0.4% |
| NALCOAG 1060 | |
| Colloidal silica as $SiO_2$ = | 50% |
| pH = | 8.5 |
| Average Particle Size = | 50–70 nm |
| Average Surface Area = | 40–60 $M^2$/gram |
| Specific Gravity (at 68° F.) = | 1.390 |
| Viscosity at 77° F. = | 15 cps (maximum) |

In addition to those sols described above, other silica sols as well as their method of manufacture is set forth and described in U.S. Pat. No. 3,901,992, which is incorporated herein by reference. Finally, we have discovered that improved results can be obtained when the silica sols and/or gels are obtained by dispersing fumed silica into an aqueous media containing the piperazine compounds.

The Piperazine or Lower Alkyl Nitrogen Substituted Piperazine

These amines comprise piperazine itself as well as piperazines containing lower alkyl substituents on the nitrogen portion of the piperazine molecules. The lower alkyl nitrogen-substituted pierazines may be illustrated by piperazines having lower alkyl groups containing from 1–4 carbon atoms. The alkyl groups may be composed of hydrogen and carbon although they may contain other substituents such as OH, amino groups and the like.

Lower alkyl nitrogen-substituted piperazines that may be used in the practice of the invention are the following compounds:

N—Aminoethylpiperazine
1,4—Bis (3-aminopropyl) piperazine

Of the above compounds, piperazine is preferred.

The amount of piperazine or lower alkyl nitrogen-substituted piperazines that are used is between 0.1–5% by weight based on the weight of the $SiO_2$ content of the aqueous silica. The preferred amount is 1.0–5% and, most preferably, 2–4%. As indicated in U.S. Pat. Nos. 4,169,337 and 4,462,188 previously cited, the polishing operation is conducted at alkaline pH's usually in excess of 10. Thus it is necessary to adjust the polishing solutions to a pH of about 11 or greater. This may be done with either a sodium base or a potassium base depending upon the particular effects thought to be achieved in the final polishing operation.

Advantages of the Invention

Piperazine in combination with silica sols for wafer polishing applications offers a number of advantages as does piperazine in combination with fumed silicas. The advantages can be summarized as follows:

1. Piperazine at a 2% level requires less colloidal silica than aminoethylethanolamine to give the same polishing rate.
2. Piperazine in the presence of colloidal silica shows no discoloration of the product with time.
3. Piperazine at a 2% level in the presence of colloidal silica requires no additional chemical to kill or inhibit microbiological growths.
4. Silica wafer polishing requires high pH's. Piperazine systems being highly basic require less caustic to make pH adjustments.
5. Fumed silica aqueous/dispersions in the presence of piperazine show +10.6% to +18.2% improvement in polishing rate over colloidal silicas containing piperazine at the same silica level (2.4%) or with colloidal silicas containing aminoethylethanolamine at a higher silica level (3.2%). For example, 30 grams of Cabosil M-5 were dispersed in 67.78 grams of water containing 0.22% potassium hydroxide and 2.0% piperazine flake. The dispersed fumed silica formulation, when diluted one part product plus fourteen parts of water, produced the above polishing resuts.

EXAMPLES

To illustrate the advantages of the invention, a polishing test was conducted as described and set forth in U.S. Pat. No. 4,169,337. The results of these tests are set forth below.

In the tests to be described hereinafter, the compositions of the invention were compared against a commercial silica gel amine-containing product which is of the type described in U.S. Pat. No. 4,169,337. This product is an aqueous colloidal silica gel. It has an average particle size of 50–100 nanometers, is sodium stabilized, and contains 50% by weight of colloidal silica particles and 2% by weight of aminoethylethanolamine. Similar results are obtained with piperazine plus bases other than sodium hydroxide. This commercial material is hereafter referred to as Composition 1.

GLOSSARY
Products for Silicon Wafer Polishing

| | | |
|---|---|---|
| Comp. 2 | Na-Stab | 40% $SiO_2$ plus 1.2% piperazine |
| Comp. 3 | Na-Stab | 40% $SiO_2$ plus 1.6% piperazine |
| Comp. 4 | Na-Stab | 40% $SiO_2$ plus 2.0% piperazine |
| Comp. 5 | Na-Stab | 40% $SiO_2$ plus 2.5% piperazine |
| Comp. 6 | Na-Stab | 40% $SiO_2$ plus 3.0% piperazine |
| Comp. 7 | K-Stab | 40% $SiO_2$ plus 1.6% piperazine |
| Comp. 8 | K-Stab | 40% $SiO_2$ plus 2.0% piperazine |
| Comp. 9 | Na-Stab | 40% $SiO_2$ plus 2.0% piperazine plus 140 ppm EDA |
| Comp. 10 | Commercial Silica 1 | 30% $SiO_2$ |
| Comp. 11 | Experimental silica, K-Stab | 30% $SiO_2$ plus 2.0% piperazine |
| Comp. 12 | Experimental silica, K-Stab | 30% $SiO_2$ plus 2.0% piperazine |
| Comp. 13 | Exp. silica, K-Stab | 30% $SiO_2$ plus 2.0% piperazine |

TABLE I
SUMMARY OF STRASBAUGH POLISHING MACHINE TESTS

| | Dilution | % $SiO_2$ Used | pH | Amt. 45% KOH Used per 10 L | Pressure (psi) | Temp. (°C.) | Polishing Time | No. of Runs | Polish Rate* mils/10 min. | % Diff. from 2350 |
|---|---|---|---|---|---|---|---|---|---|---|
| Comp. 1 | 20/1 | 3.2 | 11.1 | 6.6 gm | 8 | 49–51 | 10 | 5 | 0.93 | — |
| Comp. 2 | 20/1 | 2.4 | 11.2 | 6.6 gm | 8 | 46–52 | 10 | 2 | 0.89 | −4.4% |
| Comp. 3 | 20/1 | 2.4 | 11.1 | 6.6 gm | 8 | 48–51 | 10 | 3 | 0.94 | +1.1% |
| Comp. 4 | 20/1 | 2.4 | 11.1 | 6.6 gm | 8 | 47–51 | 10 | 2 | 0.96 | +3.2% |
| Comp. 5 | 20/1 | 2.4 | 11.1 | 6.6 gm | 8 | 47–51 | 10 | 2 | 0.98 | +5.4% |
| Comp. 6 | 20/1 | 2.4 | 11.1 | 6.6 gm | 8 | 47–51 | 10 | 2 | 0.97 | +4.3% |
| Comp. 7 | 20/1 | 2.4 | 11.1 | 6.6 gm | 8 | 44–51 | 10 | 2 | 0.93 | 0 |
| Comp. 8 | 20/1 | 2.4 | 11.2 | 6.6 gm | 8 | 43–49 | 10 | 2 | 0.91 | −2.2% |
| Comp. 1 | 20/1 | 3.2 | 10.6 | 6.6 gm | 8 | 46–51 | 10 | 3 | 0.95 | — |
| Comp. 8 | 20/1 | 2.4 | 11.0 | 6.6 gm | 8 | 47–52 | 10 | 2 | 0.94 | −1.0% |
| Comp. 9 | 20/1 | 2.4 | 11.2 | 6.6 gm | 8 | 46–51 | 10 | 2 | 0.94 | −1.0% |

TABLE II
SUMMARY OF STRASBAUGH POLISHING MACHINE TESTS

| | Dilution | % $SiO_2$ Used | pH | Amt. 45% KOH Used per 10 L | Pressure (psi) | Temp. (°C.) | Polishing Time | No. of Runs | Polish Rate* mils/10 min. | % Diff. from 2350 |
|---|---|---|---|---|---|---|---|---|---|---|
| Comp. 1 | 20/1 | 3.2 | 11.0 | 6.6 gm | 8 | 47–51 | 10 | 5 | 0.96 | — |
| Comp. 8 | 20/1 | 2.4 | 11.2 | 6.6 gm | 8 | 45–50 | 10 | 3 | 0.94 | −2.1% |
| Comp. 10 | 10/1 | 3.2 | 11.0 | 6.6 gm | 8 | 44–53 | 10 | 2 | 0.66 | −31.2% |
| Comp. 11 | 10/1 | 3.2 | 11.1 | 13.2 gm | 8 | 45–51 | 10 | 2 | 1.08 | +12.5% |

TABLE III

SUMMMARY OF STRASBAUGH POLISHING MACHINE TESTS

|  | Dilution | % SiO2 Used | pH | Amt. 45% KOH Used per 10 L | Pressure (psi) | Temp. (°C.) | Polishing Time | No. of Runs | Polish Rate* mils/10 min. | % Diff. from 2350 |
|---|---|---|---|---|---|---|---|---|---|---|
| Comp. 1 | 20/1 | 3.2 | 11.1 | 6.6 gm | 6.8 | 44–51 | 10 | 2 | 0.91 | — |
| Comp. 11 | 14/1 | 2.4 | 11.1 | 9.9 gm | 6.8 | 44–52 | 10 | 1 | 1.04 | +14.3% |
| Comp. 12 | 6/1 | 3.2 | 11.1 | 6.6 gm | 6.8 | 45–52 | 10 | 2 | 1.06 | +16.5% |
| Comp. 13 | 10/1 | 3.2 | 11.0 | 6.6 gm | 6.8 | 44–51 | 10 | 2 | 1.04 | +14.3% |
| Comp. 1 | 20/1 | 3.2 | 11.2 | 6.6 gm | 6.8 | 44–51 | 10 | 2 | 0.90 | — |
| Comp. 8 | 20/1 | 2.4 | 10.4 | 6.6 gm | 6.8 | 43–51 | 10 | 2 | 0.90 | 0 |
| Comp. 11 | 14/1 | 2.4 | 10.7 | 9.9 gm | 6.8 | 45–52 | 10 | 2 | 1.04 | +15.6% |
| Comp. 11 | 10/1 | 3.2 | 10.8 | 13.2 gm | 6.8 | 45–52 | 10 | 2 | 1.09 | +21.1% |

TABLE IV

SILTEC POLISHING MACHINE TESTS

|  | Dilution | % SiO2 Used | pH | Amt. 45% KOH Used per 10 L | Pressure (psi) | Temp. (°C.) | Polishing Time | Run No. | Polish Rate* mils/10 min. | % Diff. from 2350 |
|---|---|---|---|---|---|---|---|---|---|---|
| Comp. 1 | 20/1 | 3.2 | 11.1 | 6.6 gm | 6.4 | 40–51 | 20 | 1 | 0.85 | |
|  |  |  |  |  |  |  |  | 2 | 0.86 | |
|  |  |  |  |  |  |  |  | 3 | 0.86 | |
|  |  |  |  |  |  |  |  | 4 | 0.87 | |
|  |  |  |  |  |  |  |  | 5 | 0.89 | |
|  |  |  |  |  |  |  |  | AVE. = | 0.87 | |
| Comp. 8 | 20/1 | 2.4 | 11.2 | 6.6 gm | 6.4 | 40–51 | 20 | 1 | 0.83 | |
|  |  |  |  |  |  |  |  | 2 | 0.83 | |
|  |  |  |  |  |  |  |  | 3 | 0.83 | |
|  |  |  |  |  |  |  |  | 4 | 0.86 | |
|  |  |  |  |  |  |  |  | 5 | 0.84 | |
|  |  |  |  |  |  |  |  | AVE. = | 0.84 | −3.4% |
| Comp. 10 | 10/1 | 3.2 | 11.0 | 6.6 gm | 6.4 | 40–51 | 20 |  | 0.50 | −42.5% |

TABLE V

SUMMARY OF SILTEC POLISHING TESTS

Pressure - 6.8 psi
Polishing Time - 20 minutes

|  | Dilution | % SiO2 Used | pH | Amt. 45% KOH Used per 10 L | Temp. (°C.) | No. of Wafers | Polish Rate* mils/10 min. | % Diff. from 2350 |
|---|---|---|---|---|---|---|---|---|
| Comp. 1 | 20/1 | 3.2 | 11.2 | 6.6 gm | 40–51 | 28 | 0.86 | — |
| Comp. 1 | 20/1 | 3.2 | 10.9 | 6.6 gm | 40–50 | 28 | 0.89 | — |
| Comp. 8 | 20/1 | 2.4 | 11.2 | 6.6 gm | 40–50 | 28 | 0.89 | — |
| Comp. 8 | 20/1 | 2.4 | 10.9 | 6.6 gm | 40–51 | 28 | 0.84 | −4.5% |
| Comp. 11 | 14/1 | 2.4 | 11.1 | 9.9 gm | 40–51 | 28 | 1.04 | +18.2% |
| Comp. 11 | 14/1 | 2.4 | 10.9 | 9.9 gm | 43–51 | 28 | 1.04 | +18.2% |
| Comp. 1 | 20/1 | 3.2 | 11.2 | 6.6 gm | 39–50 | 28 | 0.83 | — |
| Comp. 1 | 20/1 | 3.2 | 10.9 | 6.6 gm | 40–51 | 28 | 0.85 | — |
| Comp. 11 | 20/1 | 1.7 | 11.1 | 14.1 gm | 40–50 | 28 | 0.92 | +4.5% |
| Comp. 11 | 20/1 | 1.7 | 10.8 | 14.1 gm | 40–50 | 28 | 0.91 | +3.4% |

TABLE VI

EFFECT OF PARTICLE SIZE AND PIPERAZINE CONCENTRATION ON POLISHING RATE

| Silica Sol Used | PD (nm) | Piperazine (1) Concentration | Polishing Rate* (mils/10 min.) | % Change from Comp. 1 |
|---|---|---|---|---|
| Nalco 1050 | 20 | 5% | 1.42 | +1.4% |
| Nalco 1060 | 60 | 5% | 1.43 | +2.1% |
| Exp.SolSilica | 75 | 2% | 1.46 | +4.3% |
| Exp.SolSilica | 75 | 4% | 1.47 | +5.0% |
| Exp.SolSilica | 75 | 5% | 1.59 | +13.6% |
| Exp.SolSilica | 75 | 7% | 1.41 | +0.7% |
| Exp.SolSilica | 75 | 10% | 1.27 | −9.3% |

Comp. 1 Polishing Rate = 1.40 mils/10 min.

TABLE VII

EFFECT OF SUBSTITUTED PIPERAZINES ON POLISHING RATE

| Type of Piperazine Compound | Concentration | Polishing Rate* (mils/10 min.) | % Change from Comp. 1 |
|---|---|---|---|
| Piperazine | 2% | 1.46 | +4.3% |
| N—Aminoethyl piperazine | 2% | 1.35 | −3.6% |
| 1,4 Bis(3-Aminopropyl) piperazine | 2% | 1.58 | +12.8% pad damage |
| 1,4 Bis(3-Aminopropyl) piperazine | 4% | 1.62 | +15.7% pad damage |

In all of the compositions listed above, unless otherwise mentioned, the starting silica material was colloidal silica used in Comp. 1 diluted to 40% by weight silica. Also, in all of the tests listed, piperazine was used.

Table VII shows the effect of polishing with nitrogen-substituted piperazines. Some of these materials are either less effective than piperazine or cause pad damage, with existing polishing pad materials.

Having thus described my invention, I claim:

1. An improved method for polishing silicon wafers and like materials which comprises polishing them with a polishing agent comprising an aqueous colloidal silica sol or a gel which is combined with 0.1%–5% by weight of a piperazine or a lower alkyl nitrogen-substituted piperazine based on the $SiO_2$ content of the sol.

2. An improved method for polishing silicon wafers and like materials which comprises polishing them with a polishing agent comprising an aqueous colloidal silica sol or a gel which is combined with 0.1%–5% by weight of piperazine based on the $SiO_2$ content of the sol.

3. An improved method for polishing silicon wafers and like materials which comprises polishing them with a polishing agent comprising an aqueous colloidal silica sol or a gel which is combined with 0.1%–5% by weight of a lower alkyl nitrogen-substituted piperazine based on the $SiO_2$ content of the sol.

4. An improved method for polishing silicon wafers and like materials which comprises polishing them with a polishing agent which comprises an aqueous colloidal silica sol or a gel which is combined with 0.1%–5% by weight of a piperazine or a lower alkyl nitrogen-substituted piperazine based on the $SiO_2$ content of the sol and from 0.1–5% by weight of a water-soluble quaternary ammonium salt or base which contains not more than 6 carbon atoms.

5. An improved method for polishing silicon wafers and like materials which comprises polishing them with a polishing agent which comprises an aqueous colloidal silica sol or a gel which is combined with 0.1%–5% by weight of piperazine based on the $SiO_2$ content of the sol and from 0.1–5% by weight of a water-soluble quaternary ammonium salt or base which contains not more than 6 carbon atoms.

6. An improved method for polishing silicon wafers and like materials which comprises polishing them with a polishing agent which comprises an aqueous colloidal silica sol or a gel which is combined with 0.1%–5% by weight of a lower alkyl nitrogen-substituted piperazine based on the $SiO_2$ content of the sol and from 0.1–5% by weight of a water-soluble quaternary ammonium salt or base which contains not more than 6 carbon atoms.

7. A composition useful in polishing silicon wafers and like materials which comprises an aqueous colloidal silica sol or gel and from 0.1–5% by weight based on the $SiO_2$ content of the sol or gel of piperazine.

8. A composition useful in polishing silicon wafers and like materials which comprises an aqueous colloidal dispersion of fumed silica having a primary particle size within the range 5–200 nanometer and which additionally contains from 0.1 to 5.0% by weight, based on fumed silica content, of piperazine or a lower alkyl nitrogen-substituted piperazine.

* * * * *